US006845479B2

(12) United States Patent
Illman

(10) Patent No.: US 6,845,479 B2
(45) Date of Patent: Jan. 18, 2005

(54) METHOD FOR TESTING FOR THE PRESENCE OF FAULTS IN DIGITAL CIRCUITS

(75) Inventor: Richard Illman, West Lothian (GB)

(73) Assignee: Tality UK Limited (GB)

( * ) Notice: Subject to any disclaimer, the term of this patent is extended or adjusted under 35 U.S.C. 154(b) by 346 days.

(21) Appl. No.: 09/808,325

(22) Filed: Mar. 14, 2001

(65) Prior Publication Data

US 2002/0133776 A1 Sep. 19, 2002

(51) Int. Cl.$^7$ ............................................. G01R 31/28
(52) U.S. Cl. .................................. 714/739; 714/741
(58) Field of Search ........................... 714/741, 724, 714/728, 735, 736, 737, 738, 739, 726, 715, 720; 703/13–22; 324/73; 326/16, 21–34; 708/250–256, 270–290; 327/100–334; 345/26, 345, 551

(56) References Cited

U.S. PATENT DOCUMENTS

| 5,983,381 A | * | 11/1999 | Chakradhar et al. ........ 714/738 |
| 6,052,809 A | * | 4/2000 | Bowden ..................... 714/738 |
| 6,067,651 A | * | 5/2000 | Rohrbaugh et al. ......... 714/738 |
| 2002/0059546 A1 | * | 5/2002 | Yonetoku .................... 714/738 |

OTHER PUBLICATIONS

NN73033038: (Random DC Functional Test Pattern Discriminator; IBM Technical Disclosure Bulletin, Mar. 1973).*

Smith et al., "System Dependability Evaluation via a Fault list generation algorithm," Aug. 1996, IEEE Transactions on Computers vol. 45 No. 8, pp 974–979.*

Pomeranz et al., "On static compaction of test sequences for synchronous sequential circuits," Jun. 1996, 33rd Design Automation Conference Proceedings 1996., pp 215–220.*

Arlat et al., "Fault injection for dependability validation of fault–tolerant computer systems," Jun. 1989, Nineteenth International Symposium on Fault–Tolerant Computing, 1989. FTCS–19. Digest of Papers., pp 348–355.*

Chang et al., "Test set compaction for combinational circuits," Nov. 1992, First Asian Test Symposium, 1992. (ATS '92), Proceedings., pp 20–25.*

(List continued on next page.)

*Primary Examiner*—Guy J. Lamarre
(74) *Attorney, Agent, or Firm*—Gifford, Krass, Groh, Sprinkle, Anderson & Citkowski, P.C.

(57) ABSTRACT

A method of testing for the presence of faults in digital logic circuits is described. The method involves re-ordering a number of test vectors for testing digital circuits by selecting faults at random from an original fault list to form a sample fault list $F_N$ and then forming a vector set $T_{N-1}$ and then simulating the vector set $T_{N-1}$ against the fault list $F_N$. Any vector from the set $T_{N-1}$ which does not detect any fault is discarded and the remaining vectors are saved as vector set $T_N$. The method steps are repeated N times (with N having a value of 1 to M. Duplicated vector patterns in each vector set are removed and then the final vector set is initialized to produce a final vector set $T_F$.

7 Claims, 7 Drawing Sheets

OTHER PUBLICATIONS

Kajihara et al. "On compacting test sets by addition and removal of test vectors," Jun. 1994, 12th IEEE VLSI Test Symposium, 1994. Proceedings., pp 202–207.*

Pomeranz et al. "Static Compaction for two–pattern test sets" Nov. 1995, Proceedings of the Fourth Asian Test Symposium 1995., pp 222–228.*

Pomeranz et al. "Dynamic Test Compaction for synchronous sequential circuits using static compaction techniques," Jun. 1996, Proceedings of Annual Symposium on Fault Tolerant Computing, 1996., pp 53–61.*

Pomeranz et al. "An Approach for improving the levels of compaction achieved by vector omission," Nov. 1999, 1999 IEEE/ACM International Conference on Computer–Aided Design 1999. Digest of Technical Papers., pp 463–466.*

Hsiao et al. "Fast static comapction algorithms for sequential circuit test vectors" Mar. 1999, IEEE Transactions on Computers, vol. 48 No. 3, pp 311–322.*

Hsiao, M.S.; Rudnick, E.M.; Patel, J.H., Fast static compaction algorithms for sequential circuit test vectors, Mar. 1999, IEEE Transactions on Computers, vol.:48 Issue: 3, pp. 311–322.*

* cited by examiner

```
SCAN_TEST =
    pattern = 0;
    apply "grp1_load" 0 =
        chain "chain_0" =
"1111110101110000111100011001101101000001010010\
1000110000011100011010000110100111001000101011110\
11011100011000010001100011110010010010100000011\
1010101001001100101101100101100110010000110010010\
01110100000001110111101100110011101011101010010\
00100111110010101101000010011000001100001101101\
10101110110101000110110011100100011010001101100\
1010111100100000001110110010000110011000011111000\
00010010001010110011101110001111111111100111100111\
01011000111001111010001100011110111011100011100111\
00100011010101100101010111000101010101111010011000\
0011011110111011101111001110100010010001000011111\
11101100010011101101111001101111110111011100110011\
11110111000110000101111000010000111001111111101111\
0101000010000001000110101010111110100111011011010100\
0111101111101111111110100110101100111000110001100100\
1101111011110010000100001011111111110000010110011\
100100110011100111101010000001101001010011000110110\
1110000010101101011010100101101111111101010011110001\
0001101001111110110001010011011010101101010100100110\
10111101010111000100001001110000110000110000110111\
0110110110000110011010011000011011000001011110110\
11010011011110000110001001110001110110101001000110\
110000011011111111110111101110100100011010100000111\
10110110010001011000011000100111010101111011001\
11110001010001000110001110011101011100001000100000\
10110110111010010011001001110110010010100010110111\
10011100101100110110010011000001010110101011110100\
01010000101101101100100101011000010011011100010110\
001111100010101111000000010010100001101100001100\
    00011101110010000111001000001011000111000001";
```

Prior Art

Fig. 1(a)

chain "chain_1".=
"1011110010101010001111110011100011011001101100111\
0111001110100110011111011000011010101011110110\
0011101000100011011010101101010101001001000010101\
0100101010000110100110010011011000001001100000101\
0101001110000000010101011011000011111101000101000\
01011000101011100111011001001100111101000110110000\
0011111110000011101100000011100111101100110011010\
110111000000000100010101100001111110001101000110\
110110010000000110001110100010111011100110101011111\
000100010101101100100111111011001000011111110000\
111001000111011100110110010110110001101110110011000\
001100011000101101111010010111010111000010110100100\
000110110101001111010010010110101001110110001101011\
010100000011001101000000111111100100101000001100011\
000001110101110110000101000111000110011101000010101\
010000100000000011011110001001001100101000000011111\
0101000111010100000100010000001100001100000010101001\
10100011011011110000001100000110110010011101111110\
0100100010110100010111011011101000000111010000010\
1000110111110010000111010111011010110100001110110\
1011000010100011010011110110010010011110100011111\
001010111110000001111011110111010100011010001100011\
0001001100111011010000110111000010100111011111010\
1100000110010111011010110101001111010110100000121\
010011110110001111111100001001110001100110001011000\
10101110101101010100000001010001011111110111101011\
10001110010010010000011010011011000110010111110101\
01000001000000001111010001111011100010010000000101001\
1111111010011100010110111101010000010100011100000001\
11001010001101100100101101101100011011111111011010\
0111110001111111100000100110001101110110000";

Prior Art

Fig. 1(b)

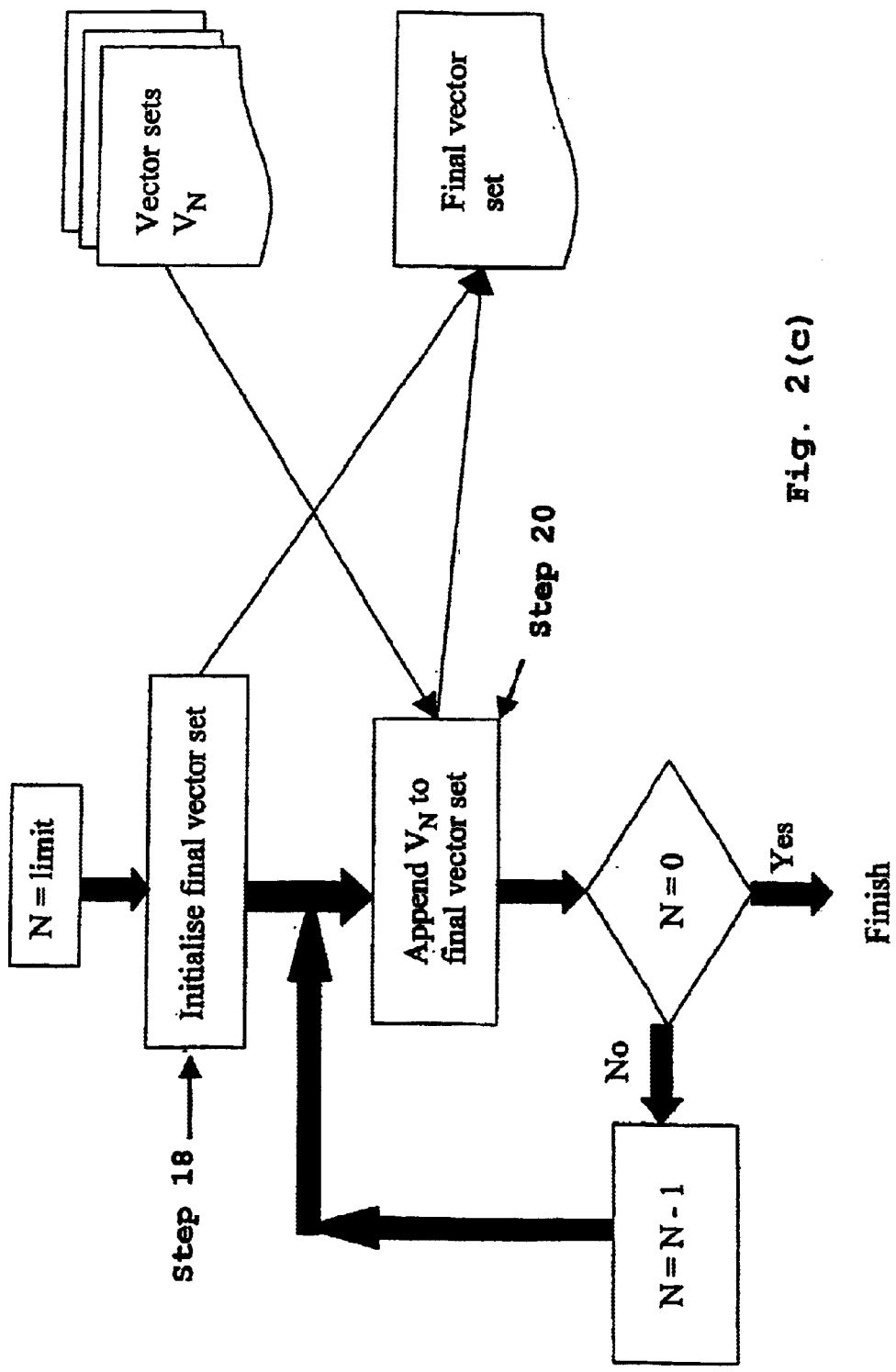

METHOD FOR TESTING FOR THE PRESENCE OF FAULTS IN DIGITAL CIRCUITS

The present invention relates to a method of testing for the presence of faults in digital logic circuits. In particular, the invention also relates to a method for re-ordering "test vectors" to achieve an improved ordering which maximises the "fault coverage" on a digital circuit which is reached with a limited number of test vectors.

The testing of faults in digital circuits using test vectors is well known. This is typically done by applying a test vector, which is a set of binary values, to a digital circuit on either the primary inputs of the circuit or via a "scan chain" connecting the state elements, which are normally flip-flops, within the digital circuit and expected response values on the circuit primary inputs are captured within the state elements, prior to being accessed via the scan chain. The term fault coverage is defined as a measure of the number of faults within the circuit which an individual test vector or set of test vectors will detect. The common fault model is "stuck-at" faults which are represented by short-circuits to power or ground on the primary inputs or outputs of logic gates within the circuit. Fault coverage is measured using a fault simulator which determines whether the output response of the circuit is affected.

A large number of existing methods for generating test vectors are known and are published in the public domain. The best known is the Roth D Algorithm, originally published in 1966 and J. P. Roth "Diagnosis of Automota Failures: A Calculus and a Method", IBM Journal of Research and Development, Vol 10, No.4,pp.278–291, July, 1966.

FIG. 1 depicts an example of a test vector comprising two scan chains, which test vector is a list of binary values to be applied to the digital circuit under test via the primary input or via a scan chain. A scan chain is a method of serially loading values into the flip-flops in the digital circuit. This is a well known and widely published design technique. In the prior art example shown, two scan chains are depicted, although any number of scan chains may be used.

Existing methods of testing for faults on an integrated digital circuit suffer from the principal disadvantage that a very large amount of test vectors is required in order to provide a satisfactory fault coverage. This can take a relatively long time and requires a relatively large amount of memory and is a limiting factor in the design and testing of such circuits.

An object of the present invention is to obviate or mitigate at least one of the above-mentioned disadvantages.

This is achieved in the broadest sense by using randomly selected fault lists to select subsets of test vectors.

According to one aspect of the present invention, there is provided a method of maximising the fault coverage on an integrated digital circuit by re-ordering a number of test vectors for testing the digital circuit, said method comprising:

a) providing an initial set of test vectors $T_0$;
b) providing an original set of faults $F_0$;
c) selecting faults at random from the original fault list to form a sample fault list $F_N$;
d) forming a vector set $T_{N-1}$ and simulating the vector set $T_{N-1}$ against fault list $F_N$;
e) discarding any vector from the vector set $T_{N-1}$ which does not detect any faults;
f) saving the remaining vectors as vector set $T_N$;
g) repeating the above steps c) to f) M times with N having a value of 1 to M so that at the end of M steps, test vectors $T_1$ to $T_M$ are saved;
h) removing duplicate vector patterns in each vector set $T_N$; and
i) initialising the final vector set and appending vector sets $V_M$ through $V_0$ to produce a final vector set $T_F$.

Preferably, in step g) M is 10 and steps c) to f) are therefore repeated ten times.

Preferably, the method of removing duplicate vector patterns is achieved by:

j) copying the original fault list $F_O$ to provide a secondary fault list $G_N$;
k) fault simulating vector set $T_N$ against $G_N$ and deleting any vectors which find no faults;
l) saving the resulting vectors as vector set $V_N$ and saving the list of undetected faults as list $G_{N-1}$;
m) repeating steps k) and l) M+1 times with N having values M to 0;

These and other aspects of the invention will become apparent from the following description, when taken in combination with the accompanying drawings, in which:

FIGS. 1(a–b) are depictions of a test vector;

Figure 2A:
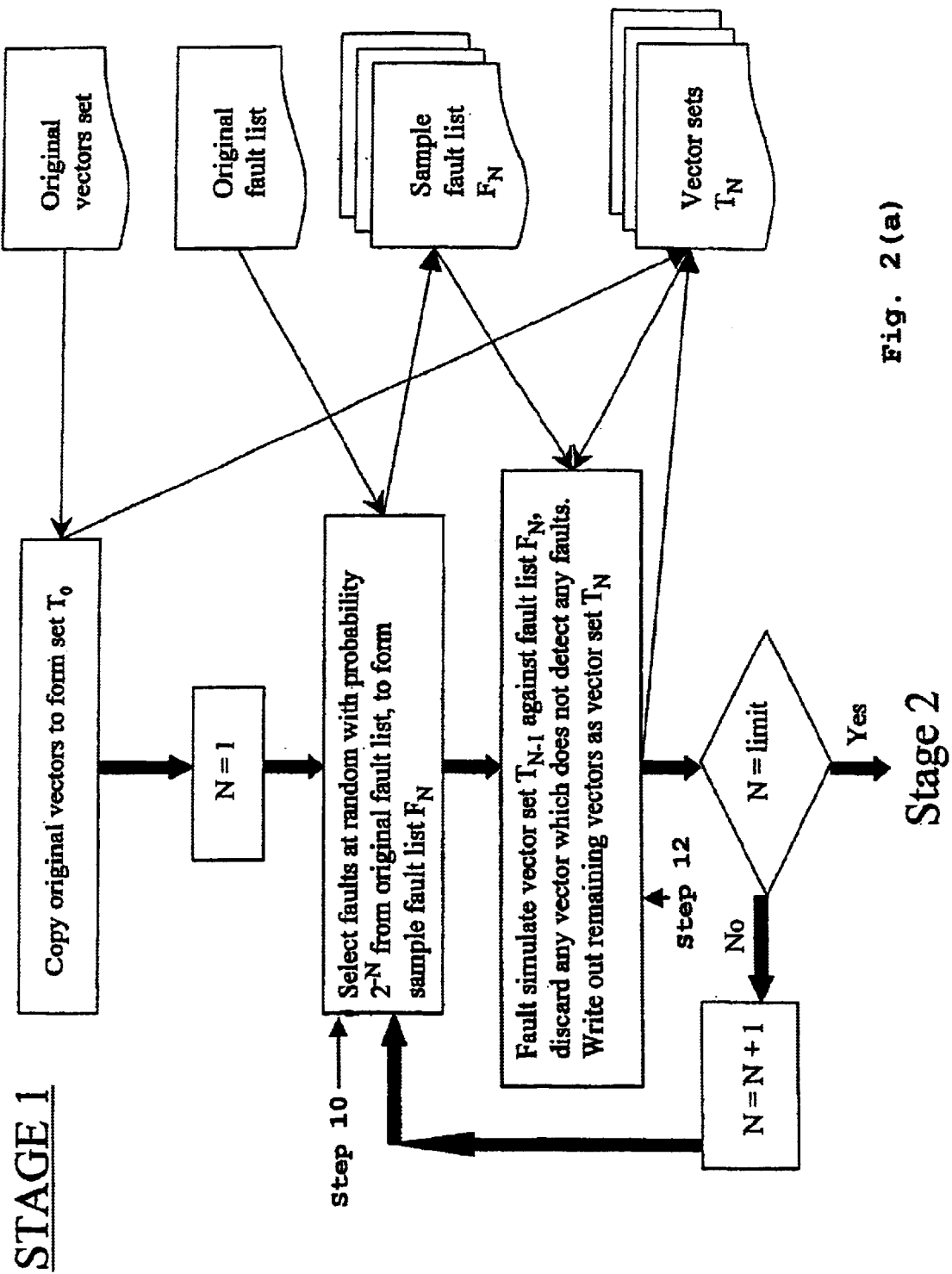
FIGS. 2(a–c) are flow charts of the steps involved in the method of re-ordering test vectors for maximising the fault coverage on a digital circuit.
Figure 2:
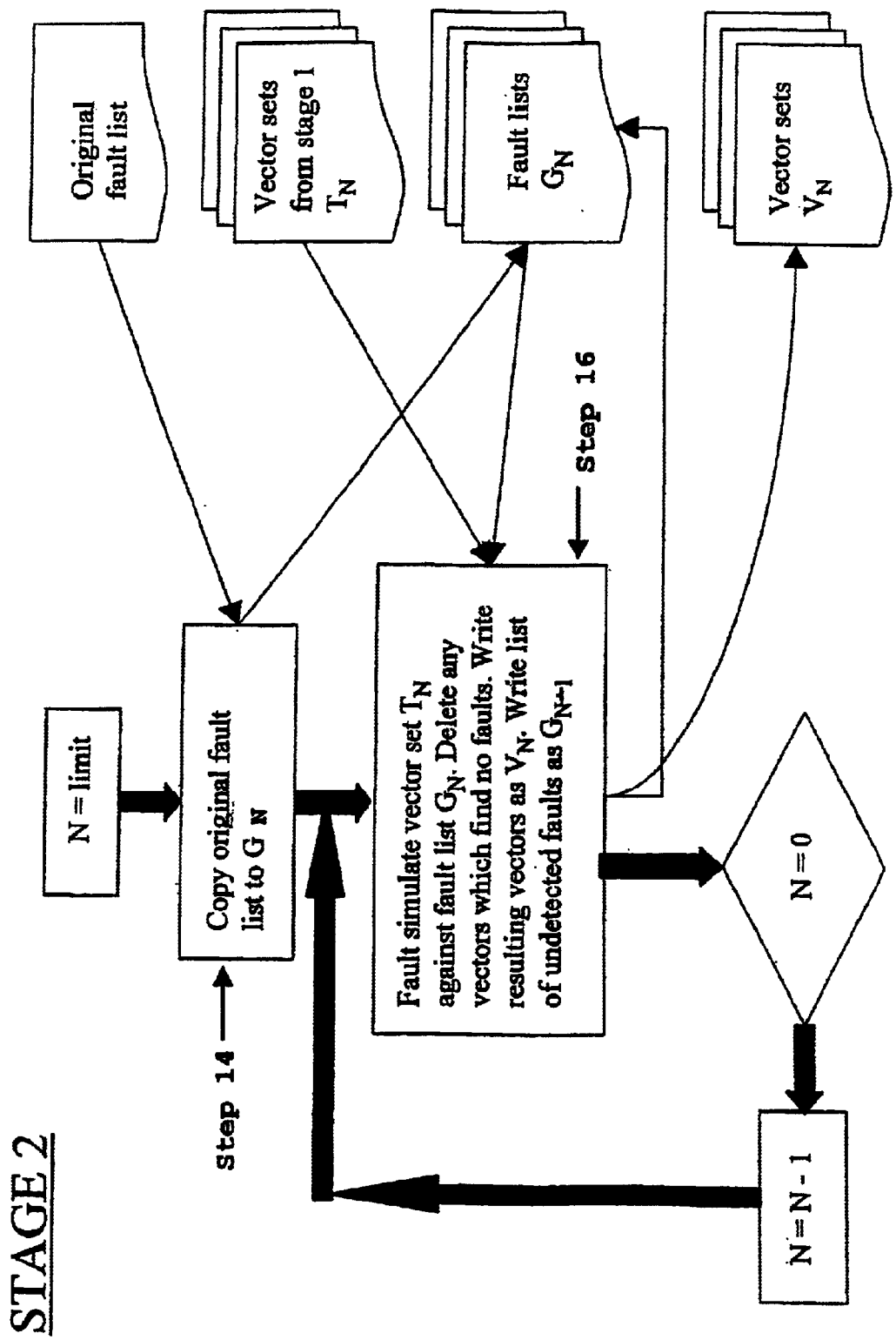
Figure 3:
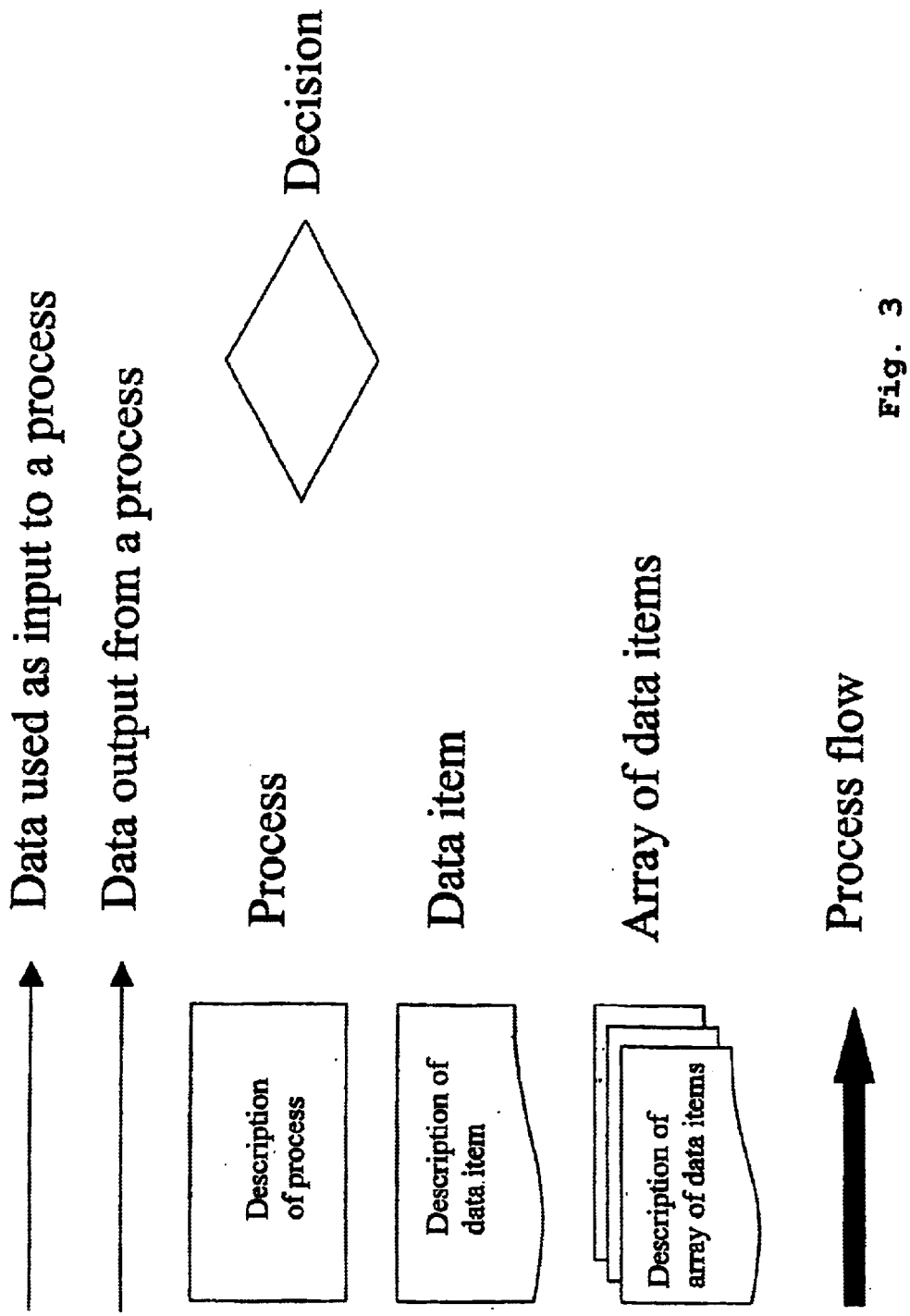
FIG. 3 is a legend to terms used in the flow chart of FIG. 2.

Reference is first made to FIGS. 2 and 3 of the drawings which depict a flow chart of a sequence of steps involved in re-ordering test vectors to provide a test vector generation pattern for maximising the fault coverage on an integrated digital circuit using a limited number of test vectors.

In stage 1, (steps a) to f)) an initial set of vectors are provided (step a) and these are copied to form a set of test vectors $T_O$ to place these vectors in a near-optimal order for detecting a set of faults $F_O$ Stage 1 has two principal steps. In the first step (step 10), a list of faults is selected at random with a probability of $2^{-N}$ from the original fault list $F_O$ to form a sample or subset fault list $F_N$. The second major step (step 12) in stage 1 is fault simulating the vector set $T_{N-1}$ repeatedly against the fault list $F_N$ and then discarding any vector which does not detect any faults. In step 12, the ordering of individual vectors within the vector set are alternately reversed and randomised. The resulting vector set, that is those that do result in the finding of faults, is saved as vector set $T_N$.

The two major steps 10 and 12 are repeated M times where M is 10 in this example.

At the completion of the tenth step 12, there are ten sets of vectors saved, $T_1$ to $T_{10}$.

At the end of the stage 1, the method involves stage 2 wherein duplicate vector patterns are removed from the vector pattern list $T_N$. In this case the original fault list $F_O$ is again copied and denoted as fault list $G_N$ (step 14). In the next step in stage 2, step 16, the vector set $T_N$ is fault simulated against the fault list $G_N$ and any vectors which result in no faults being found are deleted. After the fault simulation, the resulting vector set is saved as $V_N$ and the list of undetected faults is saved as $G_{N-1}$. Stage 2 is repeated M plus 1 times, with N taking values M down to zero where M is 10.

The final stage in the methodology is stage 3 in which the final vector set is initialised (step 18) and vector sets $V_M$ to $V_O$ are appended together to produce a final vector set $T_F$ (step 20).

The re-ordering of the generated test vectors in the way described above allows a digital integrated circuit to be tested much quicker than with the prior art test vector ordering, such that a digital circuit can be tested in typically one tenth of the time using the prior art re-ordering test vector set. This means that much less memory is required and the design process is speeded up, resulting in a considerable economic benefit.

Figure 4:
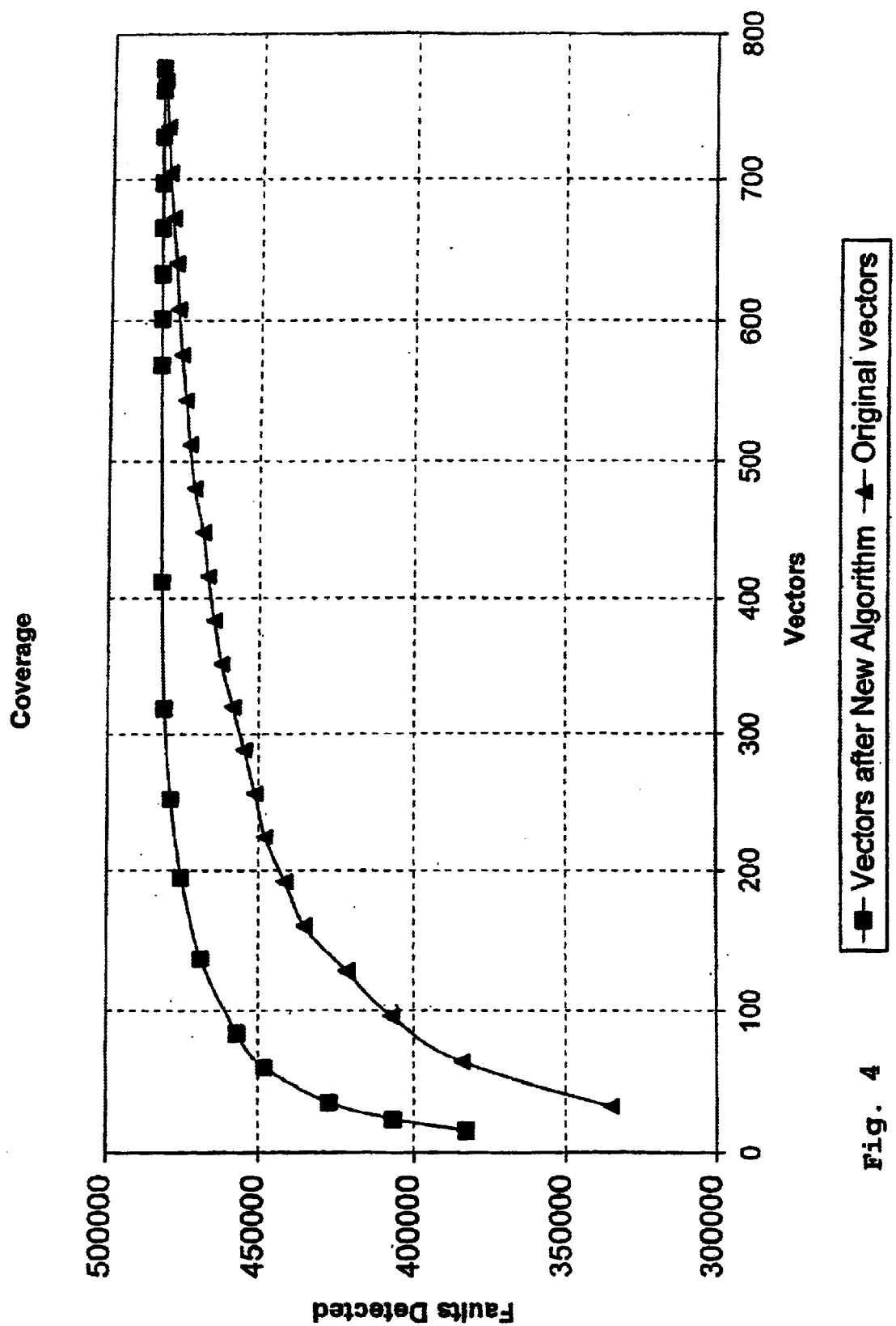
FIG. 4 is an example of a graph of fault coverage showing the number of faults detected against the number of vectors for the original vectors and vectors after using the new method/algorithm.

FIG. 4 depicts a graph of faults detected against a number of vectors. It will be seen that a larger number of faults are detected for vectors re-ordered after the new re-ordering method compared to an original number of vectors where there is less than about 700 vectors used. This increase is most dramatic for a lower number of vectors, such that this re-ordering algorithm maximises the fault coverage for a lower number of vectors when testing an integrated digital circuit.

Various modifications may be made to the reordering methodology hereinbefore described, without departing from the scope of the invention. For example, the repetition of each stage may take values in excess of or less than 10, although this will have an effect on the time taken to test the digital circuit. In addition, the probability factor of $X^{-N}$ in this example may be varied. Typically, the value of X is 2. Increasing the value of X from 2 will reduce the time taken for the re-ordering but will reduce the quality of result and decreasing the value X from 2 will result in a longer time for re-ordering but will be more accurate. In addition, the duplicate vector patterns in the vector sets are removable by an alternative method wherein a text search is conducted through the list of files of vector patterns to look for identical vector patterns and once the identical vector patterns have been identified they are deleted. It will be appreciated that after re-ordering the vectors, a larger number of faults are detected by any size of subset of the original vectors than by the original vectors themselves and, as indicated above, this significantly reduces the test time for the digital circuit and requires less memory capacity in the test apparatus, resulting in a more effective and more efficient test system.

What is claimed is:

1. A method of maximising the fault coverage on an integrated digital circuit by re-ordering a number of test vectors for testing the digital circuit, said method comprising:
   a) providing an initial set of test vectors $T_0$;
   b) providing an original set of faults $F_0$;
   c) selecting faults at pseudo-random from the original fault list to form a sample fault list $F_N$;
   d) forming a vector set $T_{N-1}$ and simulating the vector set $T_{N-1}$ against fault list $F_N$;
   e) discarding any vector from the vector set $T_{N-1}$ which does not detect any faults;
   f) saving the remaining vectors as vector set $T_N$;
   g) repeating the above steps c) to f) M times with N having a value of 1 to M so that at the end of M steps, test vector sets $T_1$ to $T_M$ are saved;
   h) removing duplicate vector patterns in each vector set $T_N$; and
   i) saving the duplicate free vector set $V_N$ with N having a value 1 to M, initialising the final vector set and appending vector sets $V_M$ through $V_0$ to produce a final vector set $T_F$.

2. A method as claimed in claim 1 wherein in step g) M is 10 and steps c) to f) are therefore repeated ten times.

3. A method as claimed in claim 2 wherein the list of faults selected from the original list of faults have a probability of $X^{-N}$ to produce subset fault list $F_N$.

4. A method as claimed in claim 1 wherein the list of faults selected from the original list of faults have a probability of $X^{-N}$ to produce subset fault list $F_N$.

5. A method as claimed in claim 4 wherein X=2.

6. A method as claimed in claim 1 wherein the step of removing duplicate vector patterns is achieved by:
   j) copying the original fault list $F_O$ to provide a secondary fault list $G_N$;
   k) fault simulating vector set $T_N$ against $G_N$ and deleting any vectors which find no faults;
   l) saving the resulting vectors as vector set $V_N$ and saving the list of undetected faults as list $G_{N-1}$;
   m) repeating steps k) and l) M times with N having values M to 1.

7. A method as claimed in claim 1 wherein the step of removing duplicate vector patterns is achieved by conducting a text search through the list of files of vector patterns looking for identical patterns, identifying the identical patterns and deleting the identical patterns identified.

* * * * *